(12) United States Patent
Ro

(10) Patent No.: US 8,754,700 B1
(45) Date of Patent: Jun. 17, 2014

(54) LINEARITY IMPROVEMENT OVER TEMPERATURE USING TEMPERATURE DEPENDENT COMMON-MODE VOLTAGES IN ACTIVE MIXER

(71) Applicant: Futurewei Technologies, Inc., Plano, TX (US)

(72) Inventor: Yoonhyuk Ro, Gainseville, FL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/732,104

(22) Filed: Dec. 31, 2012

(51) Int. Cl.
*G06G 7/16* (2006.01)
(52) U.S. Cl.
USPC .......................................... 327/359; 327/513
(58) Field of Classification Search
USPC .......................... 327/355, 356, 359, 512, 513
See application file for complete search history.

(56) References Cited

U.S. PATENT DOCUMENTS

| | | | | |
|---|---|---|---|---|
| 4,558,238 A | * | 12/1985 | Yamada et al. | 327/540 |
| 6,118,339 A | | 9/2000 | Gentzler et al. | |
| 6,639,447 B2 | * | 10/2003 | Manku et al. | 327/359 |
| 6,664,844 B1 | | 12/2003 | Spiegel | |
| 7,415,261 B2 | * | 8/2008 | Rosik et al. | 455/313 |
| 7,555,263 B1 | * | 6/2009 | Rofougaran et al. | 455/20 |
| 7,657,247 B1 | * | 2/2010 | Tsai et al. | 455/333 |
| 8,415,940 B2 | * | 4/2013 | Yin et al. | 323/314 |
| 2013/0239695 A1 | * | 9/2013 | Tai | 73/766 |

* cited by examiner

*Primary Examiner* — William Hernandez
(74) *Attorney, Agent, or Firm* — Conley Rose, P.C.; Grant Rodolph; Rayhao Chung

(57) ABSTRACT

A mixer comprising a Gilbert cell configured to receive a baseband signal and a local oscillator signal, wherein the Gilbert cell comprises a baseband transistor and a local oscillator transistor, and a biasing circuit configured to generate a bias voltage that is inversely related to temperature and coupled to the local oscillator transistor.

23 Claims, 7 Drawing Sheets

LINEARITY IMPROVEMENT OVER TEMPERATURE USING TEMPERATURE DEPENDENT COMMON-MODE VOLTAGES IN ACTIVE MIXER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Frequency mixers, or mixers, may be used in radio frequency (RF) communication systems to shift a center frequency of a data signal for more convenient processing of the data signal. Mixers may be active or passive devices. A conventional active mixer may employ a Gilbert cell.

A gain of a conventional active mixer employing a Gilbert cell may be sensitive to temperature variation. A conventional technique may compensate for temperature variation by making a common-mode voltage of baseband input transistors temperature dependent. However, this technique has a drawback that the input transistors may deviate from behaving as an ideal current source, especially at higher temperatures, which may degrade linearity of the mixer. There is thus a need to improve the linearity of active mixers employing Gilbert cells, especially as operating temperature increases.

SUMMARY

In one embodiment, the disclosure includes a mixer comprising a Gilbert cell configured to receive a baseband signal and a local oscillator signal, wherein the Gilbert cell comprises a baseband transistor and a local oscillator transistor, and a biasing circuit configured to generate a bias voltage that is inversely related to temperature and coupled to the local oscillator transistor.

In another embodiment, the disclosure includes a mixer comprising a Gilbert cell having a baseband input and a local oscillator (LO) input, and a biasing circuit coupled to a LO input transistor, wherein the biasing circuit produces a temperature dependent biasing voltage that is inversely related to temperature.

In yet another embodiment, the disclosure includes a wireless communication device comprising a mixer comprising a Gilbert cell, a common-mode baseband biasing circuit coupled to the Gilbert cell, and a common-mode LO biasing circuit coupled to the Gilbert cell and that generates a biasing voltage that is inversely related to temperature.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
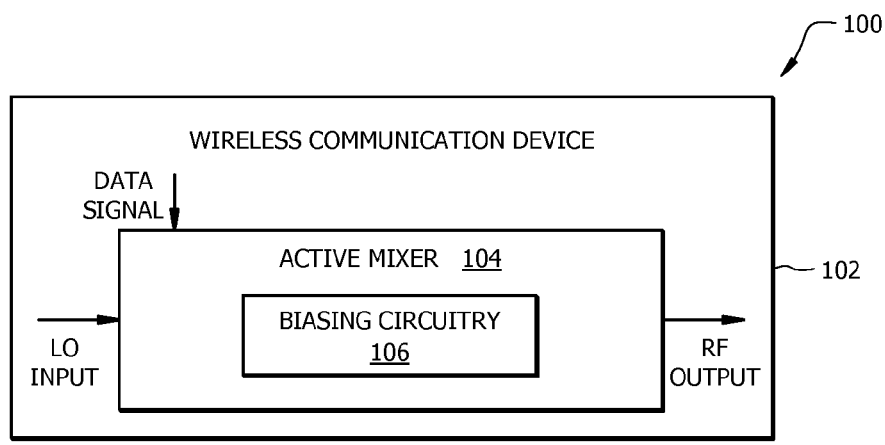
FIG. 1 illustrates an embodiment of a wireless communication device using an active mixer.

FIG. 1 illustrates an embodiment of a wireless communication device 100. The wireless communication device 100 comprises an active mixer 104, which comprises biasing circuitry 106 as shown in FIG. 1. The active mixer 104 may have an LO input at one frequency, a data signal input at a separate frequency and an RF output at yet another frequency. The active mixer 104 may mix the LO input and the data signal to generate the RF output. The RF output may be the product of the LO input and the data signal and may be at a same frequency as the LO input or a different frequency than either the LO input frequency or the data signal frequency. The RF output may be coupled to an antenna subsystem or it may couple to another mixer so that the output signal is converted to another frequency before transmission. As understood by a person of skill in the art, the antenna subsystem may generate a transmitted signal. The antenna subsystem may comprise components suitable for transmitting a signal wirelessly. That is, the antenna subsystem may include one or more antennas, filters, and/or amplifiers.

Active mixers, such as active mixer 104, may be affected by temperature changes, especially when the temperature of the circuit increases well above room temperature. The higher operating temperatures may be the result of smaller devices containing fewer outlets for heat dissipation. At high operating temperatures, active mixer 104 may experience degraded linearity resulting in poor performance of the mixer circuit and the wireless communication device 100. The degraded linearity may be due to a change in the operation of active mixer's 104 transistors due to the increase in temperature.

Figure 2:
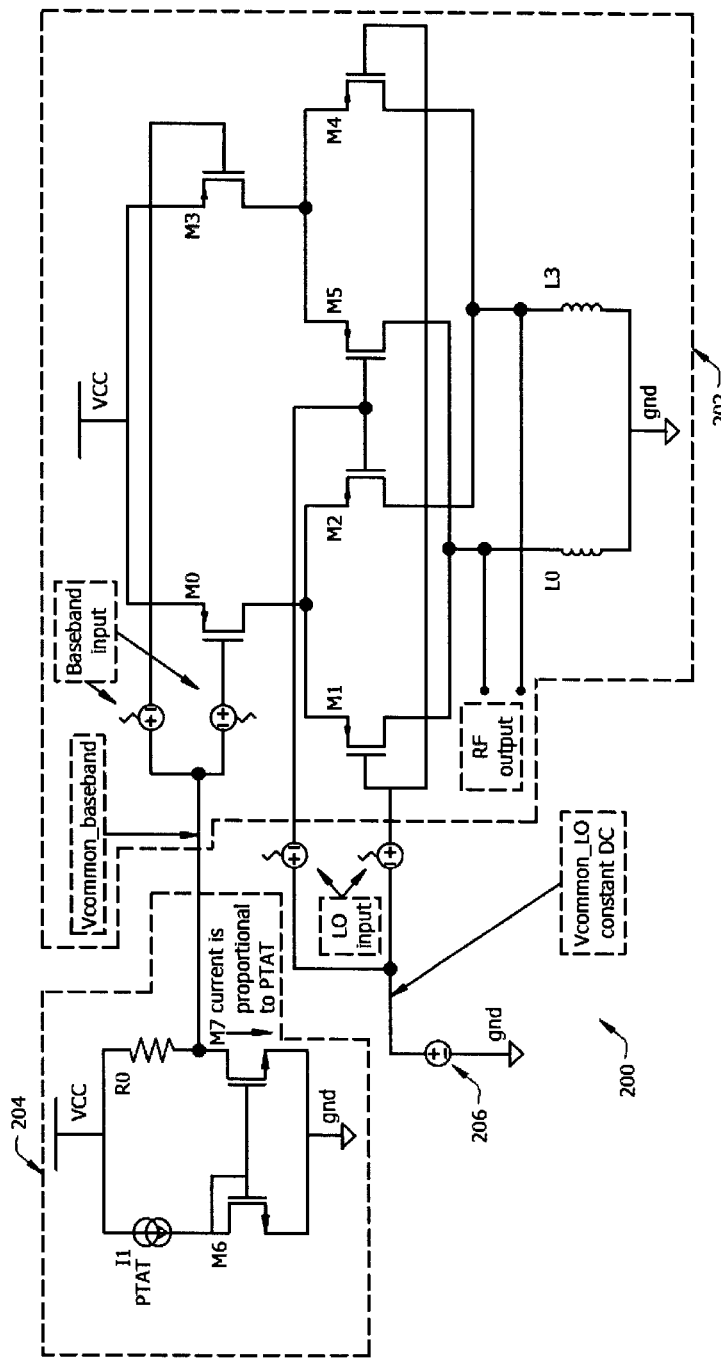
FIG. 2 is a circuit diagram of an embodiment of a conventional active mixer with a bias circuit for a baseband common-mode voltage and a DC voltage for LO common-mode voltage.

FIG. 2 is a circuit diagram of an embodiment of a conventional active mixer 200 with a bias circuit for a baseband common-mode voltage and a DC voltage for LO common-mode voltage. The active mixer 200 comprises a Gilbert cell 202, a bias circuit 204 for baseband common-mode voltage, and a DC voltage source 206 for LO common-mode voltage, baseband signal input ports or connections, LO signal input ports or connections, and an RF output port or connection configured as shown in FIG. 2. The active mixer 200 may be configured to receive a differential baseband signal and a differential LO signal as shown in FIG. 2. The active mixer 200 may be configured to generate a differential RF output as shown in FIG. 2.

The Gilbert cell 202 comprises two baseband input transistors M0 and M3, and four local oscillator (LO) input transistors M1, M2, M4, and M5 configured as shown. The baseband signal inputs M0 and M3 may be used for introducing a data signal into Gilbert cell 202 and the LO signal inputs may be used for introducing an LO signal into Gilbert cell 202. Gilbert cells, such as Gilbert cell 202, may both shift the frequency of signals and amplify an output signal due their differential gain configuration. Here, Gilbert cell 202 may produce an RF signal that is a mix of the baseband signal and the LO signal, i.e. the RF signal may reproduce the information in the data signal at a frequency that may be a combination of the frequencies of the LO and baseband signals.

The Gilbert cell 202 may be configured so that the two baseband input transistors M0 and M3 may receive the baseband data signal. The LO input transistors M1, M2, M4, and M5 may be configured to receive the LO signal. The RF output of the Gilbert cell 202 may be used to mix, or multiply, the baseband data signal and the LO input signal. The RF output may comprise two signals. One signal may be at a frequency equal to the frequencies of the LO input signal and the baseband data signal added and another signal may be at a frequency equal to subtracting the baseband data signal frequency from the LO input signal frequency.

Some conventional mixers comprise a Gilbert cell, such as Gilbert cell 202, but little to no biasing circuitry, such as biasing circuit 204. Such active mixers may be sensitive to temperature variation because a transconductance of the Gilbert cell may change with temperature. The focus in addressing this issue has traditionally been placed on the baseband input transistors since it is their operation region which may be most affected by temperature changes, which in turn affects the linearity of the active mixer's gain over temperature.

An attempt at solving this gain variation over temperature problem resulted in the baseband input transistors being driven into a less optimal operation region at high temperature, where they deviate from ideal current sources and suffer from nonlinear characteristics.

The conventional baseband bias circuit 204 may be implemented in active mixers, such as active mixer 200, and may include a current source I1, resistor R0, and transistors M6 and M7. The current source I1 may generate a current that is proportional to absolute temperature (PTAT). That is, when the temperature increases, the current it generates may increase and the current may decrease when the temperature decreases. The PTAT current may run through resistor R0 due to a current minor that is created by transistors M6 and M7. The voltage drop generated across R0 may then be subtracted from the power supply voltage $V_{cc}$. A resulting voltage at the gates of the baseband input transistors M0 and M3 may be their biasing voltage.

Biasing the baseband input transistors M0 and M3 in such a fashion may generate a biasing voltage that changes with temperature. Namely, when the temperature increases, PTAT current may increase, which may cause the voltage drop across R0 to increase. Then, since the biasing voltage is the voltage drop across R0 subtracted from $V_{cc}$, the biasing voltage may decrease. And, since the bias voltage is applied to the gates of the transistors, the gate voltage of the baseband input transistors may also decrease. Thus, as the temperature increases, the bias voltage and the gate voltage for transistors M0 and M3 may decrease. Let $V_{gs}$ for a transistor denote the absolute voltage difference between the transistor's gate and source, and let $V_{ds}$ for the transistor denote the absolute voltage difference between the transistor's drain and source. For M0 and M3, the source voltage may be $V_{cc}$, and the gate voltage may be the bias voltage generated by baseband bias circuit 204. Thus, if the gate voltage, or biasing voltage, is decreasing with temperature and $V_{cc}$ is constant, then $V_{gs}$ may increase with temperature.

At around room temperature or lower, $V_{gs}$ for M0 and M3 may cause the baseband input transistors to remain in the saturation region of operation. However, at high operating temperatures, the operating region may still tend to move toward the linear region due to $V_{ds}$ of the baseband input transistors M0 and M3 being fixed. Due to the relationship of a transistor's drain current with $V_{ds}$, an operating region of a transistor operating at a fixed $V_{ds}$ with increasing $V_{gs}$ may tend to move toward the linear region when $V_{gs}$ increases, which may affect the performance of the transistors and ultimately the active mixer 200.

Referring to FIG. 2, $V_{ds}$ for baseband input transistor M0 may be the voltage difference between $V_{cc}$ and the source voltages of the LO input transistors M1 and M2. Similarly, $V_{ds}$ for baseband input transistor M3 may be the voltage difference between $V_{cc}$ and the source voltages of the LO input transistors M4 and M5. $V_{ds}$ of the baseband input transistors being dependent upon the LO input transistors may be due to the drain of the baseband input transistors being tied to the sources of the LO input transistors. Source voltages for the LO input transistors M1, M2, M4, and M5 may depend on their gate voltages. In FIG. 2, the LO input transistors' gates may be biased by DC voltage source 206. Consequently, the voltage at the LO input transistors' sources is fixed to their gate voltages, which is the DC voltage source 206, plus Vgs of the two LO input transistors' that have their sources coupled because the LO input transistors' sources may not be directly biased by an external source. Thus, the voltage at M1's source may be DC voltage source 206 plus $V_{gs}$ of M1 and M2, which would also be the source voltage for M2. Thus, the voltage at M4's source may be DC voltage source 206 plus $V_{gs}$ of M4 and M5, which would also be the source voltage for M5.

Hence, the drain voltage of the baseband input transistor may be equal to the DC voltage source 206 plus $V_{gs}$ of the two LO input transistors, so that the drain voltage of M0 may be DC voltage source 206 plus $V_{gs}$ of M1 and M2. The drain voltage of M3 may then be DC voltage source 206 plus $V_{gs}$ of M4 and M5. The drain voltage of the baseband input transistors may increase with temperature because the current from M0 and M3 may increase, which flows into M1, M2, M4, and M5 causing $V_{gs}$ of M1 and M2 to increase. As a result, $V_{ds}$ of the baseband input transistors M0 and M3 may be the difference between $V_{cc}$ and the DC voltage source 206 plus $V_{gs}$ of M1 and M2 (or M4 and M5), which may decrease as temperature increases.

Since $V_{gs}$ of the baseband transistors M0 and M3 may increase when the temperature increases and $V_{ds}$ of M0 and M3 may decrease, the operating region of transistors M0 and M3 may shift toward the linear region at high temperatures. This potential shift in the operating region of the baseband input transistors may affect the performance of the entire mixer at elevated operating temperatures. The compromised performance of the active mixer, such as active mixer 200, manifests itself in a reduction in the linearity of the gain over temperature. Improvements to this technology may allow ever-shrinking hand held wireless components to retain maximum operating characteristics at higher temperatures.

Disclosed herein are systems and an apparatus to improve the linearity of the active mixer while maintaining overall gain over temperature. One embodiment to improve the linearity may involve forcing the biasing voltage of the LO input transistors to be temperature dependent. Another embodiment may involve the LO input transistors being biased using a voltage source that decreases with increasing temperature. In the later embodiment, due to both the baseband bias voltage and the LO bias voltage being temperature dependent, the linearity of the active mixer may be improved along with maintaining overall gain of the cell over temperature. This biasing technique may cause the $V_{ds}$ voltage of the baseband input transistors to change with temperature. The solution may involve the generation of a current that is inversely related to temperature that may then be used to produce the biasing voltage for the LO input transistors of a Gilbert cell.

Figure 3:
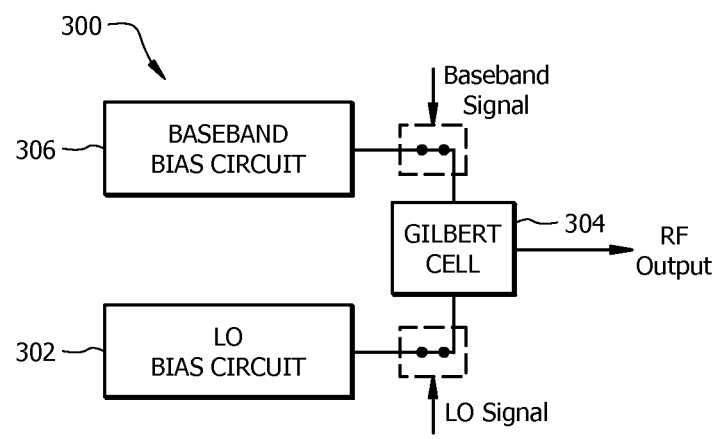
FIG. 3 is a block diagram of an embodiment of a mixer with biasing circuitry for a baseband common-mode voltage and LO common-mode voltage.

One embodiment of active mixer 104 is depicted in FIG. 3. FIG. 3 is a block diagram of mixer 300. Mixer 300 may include an LO bias circuit 302, a Gilbert cell 304, and a baseband bias circuit 306 configured as shown in FIG. 3. The Gilbert cell 304 may comprise a differential amplifier including modulation inputs for the baseband frequency and LO inputs for the data modulation signal along with an RF output. The Gilbert cell 304 may be configured the same as the Gilbert cell 202 in FIG. 2. For example, the Gilbert cell 304 may be connected to voltage source $V_{cc}$ through baseband input transistors and connected to ground through inductors L0 and L3. The baseband bias circuit 306 may bias the baseband input transistors by either a constant voltage source or a temperature dependent voltage source and may be connected to the gates of the baseband input transistors. The baseband bias circuit 306 may be configured the same as the baseband bias circuit 204 in FIG. 2.

In accordance with various embodiments, LO bias circuit 302 may be designed to produce a temperature dependent biasing voltage that is inversely related to temperature. By making the LO input transistors gate voltage inversely proportional to temperature, the change of $V_{gs}$ of the baseband transistors does not affect their operation region as severely, therefore their operating region may remain in saturation even at high temperature. The LO bias circuit 302 may be designed to generate a voltage that is inversely proportional to temperature by utilizing a current that is inversely related to temperature. This current may then be passed through a resistor that connects the LO input transistors to ground. The voltage drop generated across the resistor may be used as the biasing voltage of the LO bias circuit 302. Since the current decreases with increasing temperature, the voltage drop, and therefore the biasing voltage, may decrease with increasing temperature.

Figure 4:
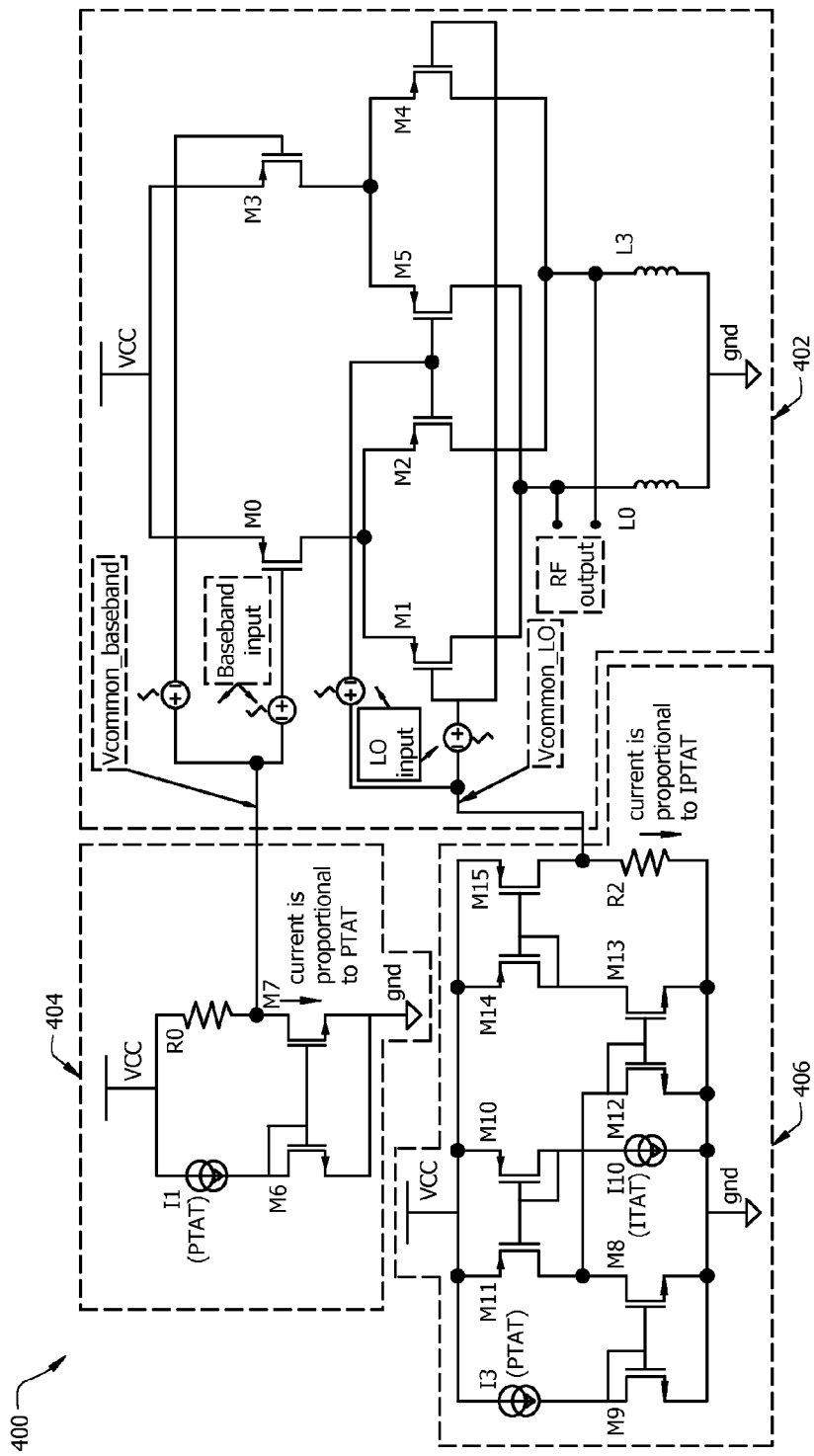
FIG. 4 is a circuit diagram of an embodiment of a mixer with biasing circuitry for a baseband common-mode voltage and LO common-mode voltage.

One exemplary embodiment of LO bias circuit 302 that may be inversely related to temperature is depicted by active mixer 400 in FIG. 4. FIG. 4 is a circuit diagram of an embodiment of a mixer 400 with biasing circuitry 406 for a LO common-mode voltage. The mixer 400 comprises a Gilbert cell 402, a baseband bias circuit 404, and a LO bias circuit 406 configured as shown in FIG. 4. Gilbert cell 402 comprises six transistors coupled in a differential amplifier configuration with two baseband transistors and four LO transistors to effectuate mixing of the baseband and LO signals. The transistors in FIG. 4 represent PFETs, but NFETs and BJTs could also be utilized to implement the circuit. Baseband bias circuit 404 may generate a biasing voltage on the gates of baseband input transistors that decreases when the temperature increases and may be substantially configured as described above.

As described above, active mixers may experience a reduction in their linearity of their gain at high temperatures. One way to maintain active mixer's 400 linearity at high temperature is to make $V_{ds}$ of the baseband input transistors temperature dependent. Specifically, making the LO input transistor's gate voltage inversely related to temperature, e.g., to decrease with increasing temperature, may cause active mixer's 400 gain to remain in a more optimal operating region over temperature.

Referring to FIG. 4, coupling the baseband and LO transistors as shown in Gilbert cell 402 may cause the baseband transistors' $V_{ds}$ to be dependent on the LO input transistors' $V_{gs}$. The LO input transistors' $V_{gs}$ may be dependent on the biasing voltage of the LO input transistors since the LO input transistors may be biased by connecting their gates to LO bias circuit 406. When LO bias circuit 406 as in FIG. 4 is used to bias the LO input transistors of Gilbert cell 402, their biasing voltage may become inversely related to temperature, meaning gate voltage will decrease with increasing temperatures. Biasing the LO input transistors in this fashion may cause the baseband input transistors' $V_{ds}$ to become temperature dependent, which in turn may solve the linearity problem.

The LO bias circuit 406 comprises a proportional to absolute temperature (PTAT) DC current source I3, an independent to absolute temperature (ITAT) DC current source I10, transistors M8, M9, M10, M11, M12, M13, M14, and M15, and a resister R2 configured as shown in FIG. 4. The transistors of LO bias circuit 406 are configured into a succession of current minors. A current minor may comprise a pair of transistors connected in a manner so that one of the transistors may be forced to carry the same current as the other transistor, which may be acting as a reference. The two transistors may be connected to each other's gate with one of the transistors, the reference transistor, connected as a diode. Connecting a transistor as a diode may require connecting its gate and drain together. For example, transistors M8 and M9 of LO bias circuit 406 may be connected as a current minor since their gates are connected to each other and M9's gate and drain are connected. A current minor may minor current because the non-diode connected transistor may be forced to carry the same current as the reference transistor, or diode-connected transistor. For example, again referring to transistors M8 and M9 of LO bias circuit 406, M9 may have PTAT current running through it since M9 is connected in series with the PTAT current source, I3. Since M8's gate is connected to M9's gate and M9 is diode-connected, M8 may be forced to also carry PTAT current generated by I3. In other words, M8 is current mirrored with M9, or M8 and M9 are current mirrored.

Referring back to LO bias circuit 406 of FIG. 4, it may be evident that there are four sets of current mirrors and they are: M8 and M9, M10 and M11, M12 and M13, and M14 and M15. Applying the current mirror analysis to LO bias circuit 406, the current flowing in M9 may also be flowing in M8; M10's current may be flowing in M11; M12's current may be flowing in M13; and M14's current may be flowing in M15.

Lastly, the current flowing through M15 may also be flowing through R2 since they are in series with each other. Thus, the current running through R2 may generate a voltage drop using the current being carried by M15

Referring again to LO bias circuit 406 of FIG. 4, M9 may carry PTAT current, which may force M8 to also carry PTAT current. M10 may carry ITAT current from current source I10 since they are in series, which then may force M11 to carry ITAT current generated by I10. M8 and M11 are in series with each other, but they may not be carrying the same current. They may not be carrying the same current since they are current mirrored to different references. Nevertheless, M12 is connected between M8 and M11 and may be forced to carry the difference in current between M8 and M11.

Since M8 may be forced to carry PTAT current and M11 may be forced to carry ITAT current, M12 may then carry the current difference of ITAT and PTAT. ITAT current minus PTAT current may be designated as inversely proportional to absolute temperature (IPTAT) current. Continuing on with the current tracing of the circuit, since M12 may be carrying IPTAT current, M13 may be forced to carry IPTAT current also. M14, in series with M13, may also be carrying IPTAT current, which in turn may force M15 to carry IPTAT current. Lastly, since M15 may be in series with R2, R2 may have IPTAT current running through it, which may result in generating a voltage drop from IPTAT current across R2.

Since IPTAT current may be inversely related to temperature, the voltage drop generated by IPTAT passing through R2 may also be inversely related to temperature. Since the bias voltage generated by LO bias circuit 406 is taken from the voltage drop across R2 and is connected to the gates of the LO input transistors, the LO input transistors' gate voltage and their gate voltage may also be inversely related to temperature.

Since the baseband input transistors' $V_{ds}$ is the difference between $V_{cc}$ and the LO input transistors' source voltage, the temperature dependence of the LO input transistors' $V_{gs}$ will cause the baseband input transistors' $V_{ds}$ to also be temperature dependent. In accordance with various embodiments, utilizing the LO bias circuit 406, which is temperature dependent, as the temperature of the Gilbert cell 402 increases, the LO input transistors' $V_{ds}$ may decrease and both the baseband input transistors' $V_{gs}$ and $V_{ds}$ may increase. Because the baseband input transistors' $V_{gs}$ and $V_{ds}$ may be both changing together, their operation region may not be affected. The operation region may not be affected if the relationship between the baseband input transistors' $V_{gs}$ and $V_{ds}$ persists at high temperature as it does at room temperature to retain operation in the saturation region. Therefore, if the operating region of the baseband input transistor's is unaffected when the temperature increases, then the linearity of the gain over temperature of the Gilbert cell 402 may not be affected.

Figure 5:
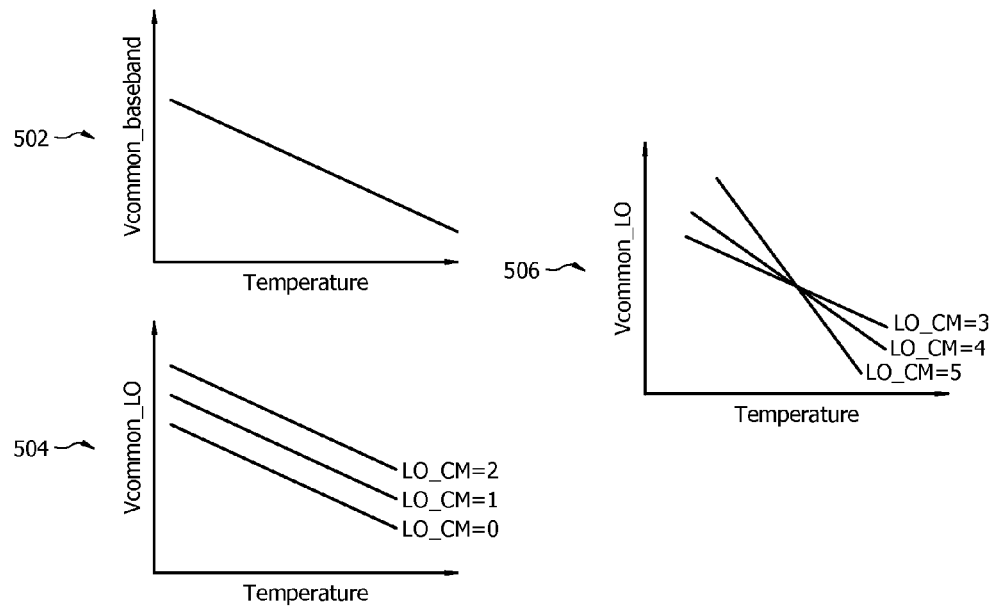
FIG. 5 depicts the temperature dependence of a biasing circuit's biasing voltage along with Gilbert cell circuitry.

FIG. 5 shows the voltage dependency on temperature for both the LO bias circuit 406 and the baseband bias circuit 404. Graph 502 illustrates the reduction in voltage of the baseband biasing voltage due to increasing temperatures. LO bias circuit's 406 temperature dependence is shown in graph 504. Graph 504 shows three separate plots notated with LO_CM=0, LO_CM=1, and LO_CM=2. The different values of LO_CM represent different R2 values used in LO bias circuit 406. By changing the ratio of PTAT to ITAT, the temperature dependence of the biasing circuit may be altered. Meaning, the slope of the line on graph 504 may change, thereby changing how much IPTAT changes with temperature. Graph 506 illustrates three separate plots notated with LO_CM=3, LO_CM=4, and LO_CM=5. The different values of LO_CM in graph 506 represent PTAT at different percentages of ITAT used in LO bias circuit 406. LO_CM=3 corresponds to PTAT being 15% of ITAT, LO_CM=4 corresponds to 25%, and LO_CM=5 corresponds to 35%.

For the LO bias circuit 406, the base values of ITAT I10 and PTAT I3 may be selected so that the current from I10 is always greater than the current from I3 regardless of temperature. Due to subtracting PTAT from ITAT, if PTAT current and ITAT current are close in value, then there may be a potential for PTAT to be greater than ITAT at high temperatures. This should be avoided because it may cause the IPTAT current flowing through R2 to reverse, which would potentially switch the polarity of the voltage drop across R2 and the biasing voltage of the LO input transistors. Also, the base values of I3 and I10 should not be selected to equal each other. If ITAT and PTAT become equal, then LO bias circuit 406 may not have any current flow through R2, which may result in the LO input transistors not being properly biased. The values of ITAT and PTAT may be chosen based on the amount of gain that is desired for the Gilbert cell 402. Typical values for ITAT may be 10 to 20 µA. PTAT may be chosen to be anywhere from 15% to 35% of ITAT, depending on the rate of change with respect to temperature desired for IPTAT.

Figure 6:
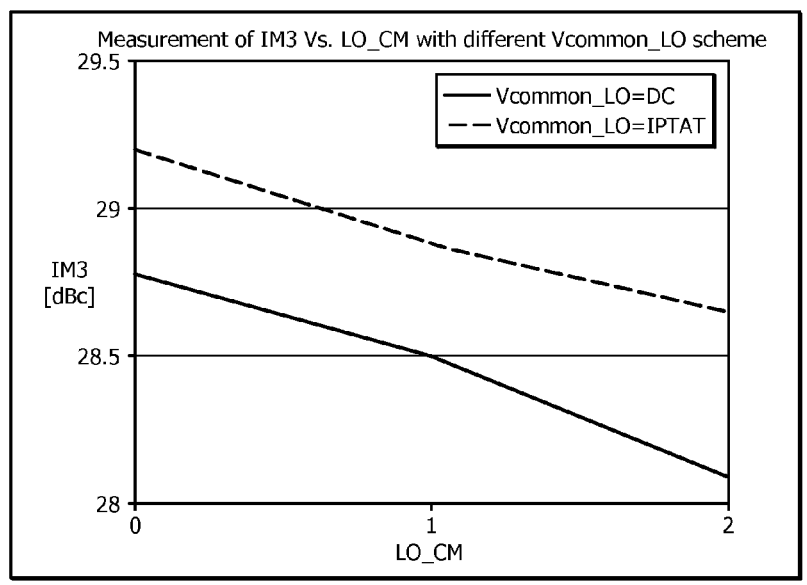
FIG. 6 illustrates third-order inter modulation versus LO bias voltage for different LO common-mode voltage biasing schemes.

FIG. 6 illustrates third order inter-modulation (IM3) versus LO bias voltage for different LO common-mode voltage biasing circuit schemes at 85° C. IM3 is a measure of the difference between the carrier frequency and the modulated third harmonic frequency, and a large value of IM3 is desired. The x-axis corresponds to the three different LO_CMs shown in FIG. 5 with LO_CM=0 corresponding to a small R2 value, LO_CM=1 corresponding to a medium R2 value, and LO_CM=2 corresponding to a large R2 value. The y-axis shows the IM3 value in units of dBc. The solid line represents the use of a constant DC biasing voltage (one that does not change with temperature) biasing the LO input transistors, such as DC voltage source 206 in FIG. 2. The dotted line represents the use of the LO bias circuit 406 having different R2 values, as noted above. Changing R2 values results in creating different biasing voltages. As can be seen, the use of the LO bias circuit 406 improves the IM3 modulation at high temperature at different R2 values. It should be noted that the baseband is being biased with the temperature dependent biasing voltage from, e.g, baseband bias circuit 404. A single chip containing all the circuitry shown in FIG. 4 was designed and processed in 90 nm CMOS and was used in producing the test results shown herein.

Figure 7:
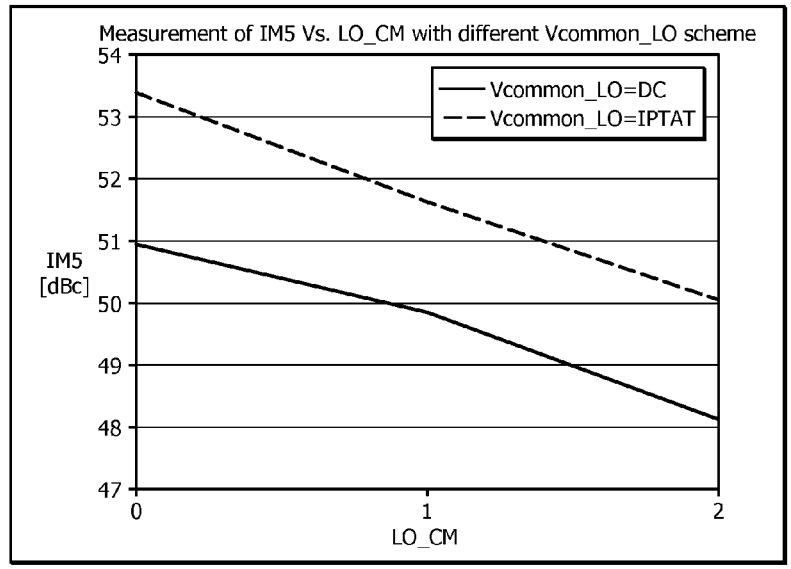
FIG. 7 illustrates fifth-order inter modulation versus LO bias voltage for different LO common-mode voltage biasing schemes.

FIG. 7 illustrates the fifth order inter-modulation (IM5) versus LO bias voltage for different LO common-mode voltage biasing circuit schemes at 85° C. As in FIG. 6, the use of a DC voltage source is represented by a solid line and the use of the LO bias circuit 406 having different R2 values is represented by a dashed line. As can be seen, the IM5 is improved at high temperature when using the temperature dependent LO bias circuit 406 as opposed to a DC voltage source 206.

Figure 8:
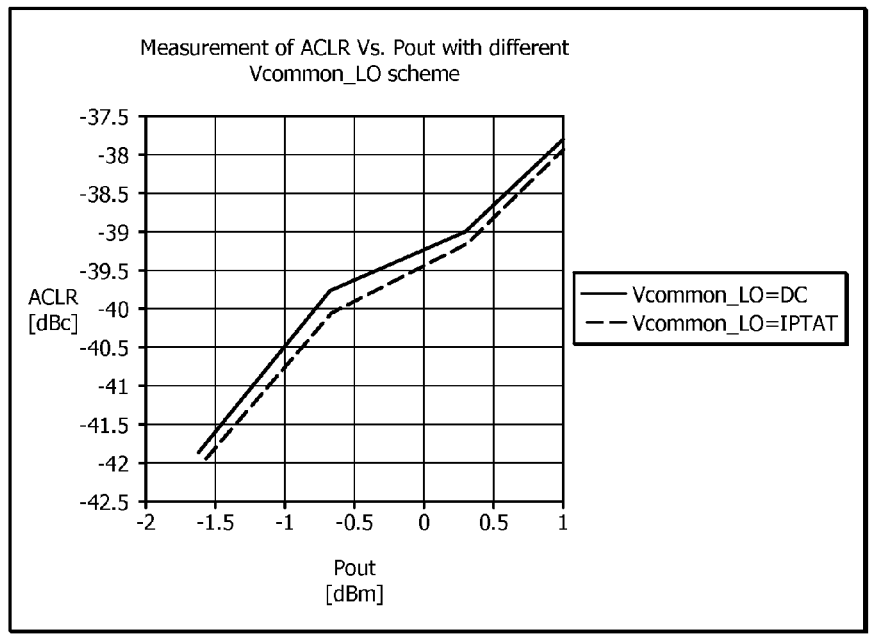
FIG. 8 illustrates adjacent channel leakage ratio versus output power for different LO common-mode voltage biasing schemes.

FIG. 8 illustrates adjacent channel leakage ratio (ACLR) versus output power for different LO common-mode voltage biasing circuit schemes at 85° C. As in FIGS. 6 and 7, the use of a DC voltage source is represented by a solid line and the use of the LO bias circuit 406 having different R2 values is represented by a dashed line. ACLR is defined as the ratio of the power in the adjacent radio channels or shoulder bands to the transmitted power. ACLR is a measure of how well tuned the circuit is for transmitting most of the power in the carrier frequency band instead of shoulder bands. The y-axis corresponds to the amount of ACLR in units of dBc and the x-axis corresponds to the output power in the transmitted channels of the carrier frequency in units of dBm. The circuits used for the ACLR measurements were the same as used for measuring IM3 and IM5, discussed above. As can be seen from FIG. 8, the ACLR is lower when using LO bias circuit 406 as opposed to the constant DC voltage source 206.

To obtain the performance curves shown in FIGS. 5 through 8, circuits corresponding to active mixer 400 were both simulated and produced using a 90 nm CMOS process. For both the simulations and the device designs and testing, the following values were used various components of the circuit. The power supply voltage $V_{cc}$ was chosen to be 2.2 V. For LO bias circuit 406 a value of 45 kΩ was chosen for R2, I10 (ITAT) was 25 μA, I3 (PTAT) was 5 μA, the width over length values for transistors M10, M11, M14, and M15 was 20/4 with both values in μm. The width over length values for transistors M8, M9, M12 and M13 was 10/4 with both values in μm. For baseband bias circuit 404 I1 (PTAT) was 20 μA, R0 was 40 kΩ, and the width over length values for M6 and M7 was 10/4 with both values in μm. The values for the various components are example values for the purposes of illustration, and the values are not limited to these values as one of skill in the art would understand.

As shown in FIGS. 6-8, changing the biasing circuitry for a Gilbert cell's LO input transistors does not adversely affect the performance of the mixer and actually improves IM3, IM5, and ACLR at high temperatures. Thus, utilizing a biasing circuit that is inversely related to temperature for the LO input transistors of a Gilbert cell improves performance, namely the linearity of the gain, over temperature and especially at high temperatures.

Figure 9:
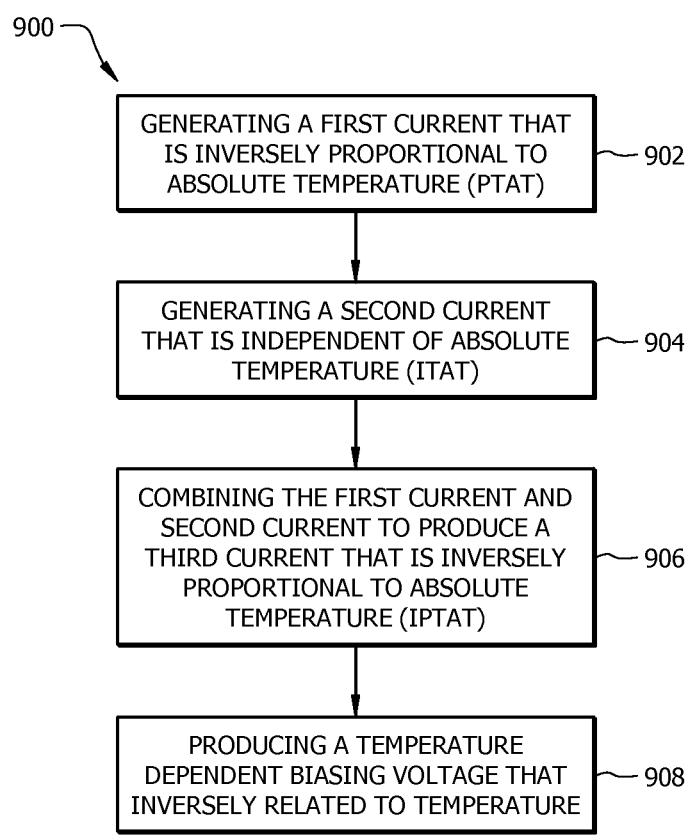
FIG. 9 is a block diagram illustrating an embodiment of a method for generating a biasing voltage that is inversely proportional to temperature.

FIG. 9 is a block diagram illustrating an embodiment of a method for generating a biasing voltage that is inversely proportional to temperature, for example that is generated by the biasing circuit 406 shown in FIG. 4. Method 900 begins in block 902 with generating a first current that is proportional to temperature (PTAT). Method 900 continues at block 904 with generating a second current that is independent of absolute temperature (ITAT). Method 900 continues at block 906 with combining the first and second currents to produce a third current that is inversely proportional to absolute temperature (IPTAT). The combination of the first and second currents to produce the IPTAT current is completed similar to how the PTAT and ITAT currents are combined through the use of current mirrors shown in the biasing circuit 406 of FIG. 4. Method 900 then continues at block 908 with producing a temperature dependent biasing voltage that is inversely related to temperature. The biasing voltage that is inversely related to temperature is produced by passing the IPTAT current through a resistor similar to how the biasing circuit 406 produces a biasing voltage that is inversely related to temperature.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term "about" means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A mixer comprising:
    a Gilbert cell configured to receive a baseband signal and a local oscillator signal, wherein the Gilbert cell comprises a baseband transistor and a local oscillator transistor; and
    a biasing circuit configured to generate a bias voltage that is inversely related to temperature and coupled to the local oscillator transistor.

2. The mixer of claim 1, wherein the temperature dependence of the bias voltage is due to a current that is inversely related to temperature.

3. The mixer of claim 1, wherein the biasing circuit is configured to generate the current inversely related to temperature by subtracting a first current that is directly related to temperature from a second current that is temperature independent.

4. The mixer of claim 1, wherein the biasing circuit further comprises:
a first current source to produce a first current; and
a second current source to produce a second current,
wherein the first current source and the second current source are operatively coupled through a plurality of transistors to generate a current inversely related to temperature, and
wherein the temperature dependence of the bias voltage is due to the current that is inversely related to temperature.

5. The mixer of claim 1, wherein the mixer is coupled to a ground through a resistor and the biasing circuit is coupled to the resistor so that a current inversely related to temperature is passing through the resistor to form a voltage drop.

6. The mixer of claim 5, wherein the voltage drop is the bias voltage.

7. A mixer comprising:
a Gilbert cell having a baseband input and a local oscillator (LO) input; and
a biasing circuit coupled to an LO input transistor, wherein the biasing circuit produces a temperature dependent biasing voltage that is inversely related to temperature.

8. The mixer of claim 7, wherein the temperature dependent biasing voltage is produced by a temperature dependent current.

9. The mixer of claim 8, wherein the temperature dependent current is proportional to an inversely proportional to absolute temperature (IPTAT) current.

10. The mixer of claim 7, wherein the biasing voltage is the voltage drop across a resistor that connects the LO input transistor to a ground.

11. The mixer of claim 7, wherein the biasing voltage is due to an inversely proportional to absolute temperature (IPTAT) current running through a resistor.

12. The mixer of claim 7, wherein an inversely proportional to absolute temperature (IPTAT) current is produced by subtracting a proportional to absolute temperature (PTAT) current from an independent to absolute temperature (ITAT) current.

13. The mixer of claim 7, wherein the biasing circuit further comprises:
an independent to absolute temperature (ITAT) current source operatively coupled to a proportional to absolute temperature (PTAT) current source through a number of current mirrors to generate an inversely proportional to absolute temperature (IPTAT) current.

14. The mixer of claim 13, wherein the IPTAT current is temperature dependent.

15. The mixer of claim 13, wherein the IPTAT current is inversely related to temperature.

16. The mixer of claim 7, wherein the Gilbert cell further comprises a baseband input transistor, and wherein the biasing circuit causes an operating region of the baseband input transistor to remain in a saturation region of operation at high operating temperatures of the Gilbert cell.

17. The mixer of claim 16, wherein the baseband input transistor remains in the saturation region of operation due to the baseband input transistor's source-to-drain voltage increasing at high temperature due to the reduction of the biasing voltage.

18. A wireless communication device comprising:
a mixer comprising:
a Gilbert cell;
a common-mode baseband biasing circuit coupled to the Gilbert cell; and
a common-mode local oscillator (LO) biasing circuit coupled to the Gilbert cell wherein the common-mode LO generates a biasing voltage that is inversely related to temperature.

19. The wireless communication device of claim 18, wherein the biasing voltage is generated by passing a current that is inversely related to temperature through a resistor that connects a common-mode LO input transistor to a circuit ground.

20. The wireless communication device of claim 18, wherein the common-mode LO biasing circuit further comprises:
a current source configured to produce a proportional to absolute temperature (PTAT) current; and
a current source configured to produce an independent to absolute temperature (ITAT) current,
wherein the PTAT current source and the ITAT current source are operatively coupled through a plurality of transistors to subtract PTAT current from ITAT current to produce an inversely proportional to absolute temperature (IPTAT) current, which equals a current that is inversely related to temperature.

21. A method comprising:
generating, by a biasing circuit, a first current that is proportional to absolute temperature (PTAT);
generating, by the biasing circuit, a second current that is independent to absolute temperature (ITAT);
combining, by the biasing circuit, the first current and the second current to produce a third current that is inversely proportional to absolute temperature (IPTAT); and
producing, by the biasing circuit, a temperature dependent biasing voltage that is inversely related to temperature.

22. The method of claim 21, wherein the biasing circuit is coupled to a common-mode local oscillator transistor of a Gilbert cell.

23. The method of claim 21, wherein the temperature dependent biasing voltage is produced by passing the IPTAT current through a resistor.

* * * * *

UNITED STATES PATENT AND TRADEMARK OFFICE
CERTIFICATE OF CORRECTION

PATENT NO. : 8,754,700 B1  
APPLICATION NO. : 13/732104  
DATED : June 17, 2014  
INVENTOR(S) : Yoonhyuk Ro Page 1 of 1

It is certified that error appears in the above-identified patent and that said Letters Patent is hereby corrected as shown below:

On the Title Page, (72) Inventor:
Delete "Yoonhyuk Ro, Gainseville, FL (US)" and insert -- Yoonhyuk Ro, Gainesville, FL (US) --.

Signed and Sealed this  
Twenty-first Day of October, 2014

Michelle K. Lee  
*Deputy Director of the United States Patent and Trademark Office*